United States Patent
Choi et al.

(10) Patent No.: US 7,327,610 B2
(45) Date of Patent: Feb. 5, 2008

(54) DRAM MEMORY WITH COMMON PRE-CHARGER

(75) Inventors: Young-Ju Choi, Seoul (KR); Gyuhong Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/245,350

(22) Filed: Oct. 5, 2005

(65) Prior Publication Data

US 2006/0098508 A1    May 11, 2006

(30) Foreign Application Priority Data

Nov. 10, 2004 (KR) ...................... 10-2004-0091454

(51) Int. Cl.
*G11C 11/34* (2006.01)
(52) U.S. Cl. .................................. 365/185.25; 365/203
(58) Field of Classification Search ................ 365/203, 365/185.25, 230
See application file for complete search history.

(56) References Cited

U.S. PATENT DOCUMENTS

| | | | | |
|---|---|---|---|---|
| 5,091,889 A | * | 2/1992 | Hamano et al. | 365/233.5 |
| 5,404,099 A | * | 4/1995 | Sahara | 324/158.1 |
| 6,301,171 B2 | * | 10/2001 | Kim et al. | 365/201 |
| 6,307,768 B1 | * | 10/2001 | Zimmermann | 365/51 |
| 6,721,217 B2 | * | 4/2004 | Madan et al. | 365/203 |

* cited by examiner

*Primary Examiner*—Amir Zarabian
*Assistant Examiner*—Jason Lappas
(74) *Attorney, Agent, or Firm*—Marger Johnson & McCollom, P.C.

(57) ABSTRACT

A memory layout where the pre-charger circuits are connected between different pairs of bit lines than are the sense amplifiers: The two bits lines in each bit line pair are connected to different pre-charge circuits and thus they can be charged to different pre-charge voltages. That is, the bit line and bit line bar sense lines in each bit line pair are connected to different pre-charge circuits. With this configuration it is possible to perform a sense stress test by activating all of the address lines at the same time and to charge to bit line and the bit bar line in each pair of sense lines to different voltages. With this configuration it is possible to reduce the number of test pads required.

20 Claims, 9 Drawing Sheets

DRAM MEMORY WITH COMMON PRE-CHARGER

RELATED APPLICATION

The present application hereby claims priority to Korean application 10-2004-0091454 filed Nov. 10, 2004. The entire content of Korean application 10-2094-0091454 is hereby incorporated herein by reference.

FIELD OF THE INVENTION

The present invention relates Dynamic Random Access Memory (DRAM) semiconductor memories and more particular to the structure and testing of DRAM memories.

BACKGROUND

Semiconductor DRAM memories conventionally include memory cell arrays, equalizer circuits, pre-charge circuits, sense amplifiers, bit lines and word lines. One commonly used structure includes twisted bit lines. FIG. 1 shows an example of a section of a simple conventional DRAM memory. The memory elements (not specifically shown) are located at the intersection of the word lines designated WL and the bit lines designed by the numbers 131 to 138. The bit lines 131 to 134 are twisted pair bit lines and the bit lines 135 to 138 are not twisted. Each pair of bit lines has an associated equalizer circuit and pre-charge circuit designated 121 to 128 and an associated sense amplifier designated 110 to 117. To improve area efficiency, each sense amplifier is used by two memory cell arrays.

The manufacturing processes for integrated circuits do not always produce perfect devices and each device must be tested after it is manufactured. Burn in testing which sometimes use elevated temperatures and elevated voltages is commonly used to insure that DRAM memories when shipped operate according to their specifications.

On commonly used burn in test creates a voltage difference between adjacent memory cells. In a memory which does not have twisted pair bit lines, this can be done by simultaneously enabling the 0, 3, 4 and 7 word lines and pre-charging the bit lines with a high voltage and then enabling the 1, 2, 5 and 6 word lines and pre-charging the bit lines with a low voltage.

With a memory that includes twisted bit lines such as that shown in FIG. 1, the test procedure described above would not result in voltage differences between all the adjacent cells. FIG. 2A illustrates the application of test voltages. FIG. 2B shows the resulting voltages on a representative number of memory cells. As indicated in FIG. 2B, the bit line BL0 intersects four high voltage cells (indicated by the circles with vertical cross-hatching) and bit line BL0B intersects four low voltage cells (indicated by the circles with horizontal cross-hatching). Thus, the sense amplifiers can sense the voltage difference between lines BL0 and BL0B. Bit lines BL1 and BL1B each intersect two high voltage cells and two low voltage cells. As a result in a memory with twisted bit lines, if all the word lines are simultaneously activaqted, there will not be an appropriate voltage between bit lines BL1 and BL1B and the test will not operate satisfactorily.

Therefore, prior art designs that address the above problem divide the word lines into groups as follows:

For the sense stress test:
WL_4k and WL_4k+3
WL_4K+1 and WL_4K+2

For the write stress test:
WL_4K and WL_4K+2
WL_4K+1 and WL_4K+3
Thus four test pads are required to activate the appropriate word lines for the tests.

SUMMARY OF THE PRESENT INVENTION

The present invention provides a memory layout where the pre-charger circuits are connected between different pairs of bit lines than are the sense amplifiers. The two bits lines in each bit line pair are connected to different pre-charge circuits and thus they can be charged to different pre-charge voltages. That is, the bit line and bit line bar sense lines in each bit line pair are connected to different-pre-charge circuits. With this configuration it is possible to perform a sense stress test by activating all of the address lines at the same time. The bit line and the bit bar line in each pair of bit lines are pre-charged to different voltages. Even though the bit lines are twisted, the voltages can be sensed when all the word lines are simultaneously activated.

A write stress test can be conducted by sequentially activating the even word lines and then odd word lines as is conventional. This requires two test pads. However, since with the present invention, the write test is conducted by activating all of the word ones simultaneously, these same two test pads can be used during the write test. As a result it is possible to reduce the number of test pads required from four to two pads.

DETAILED DESCRIPTION

Figure 1:
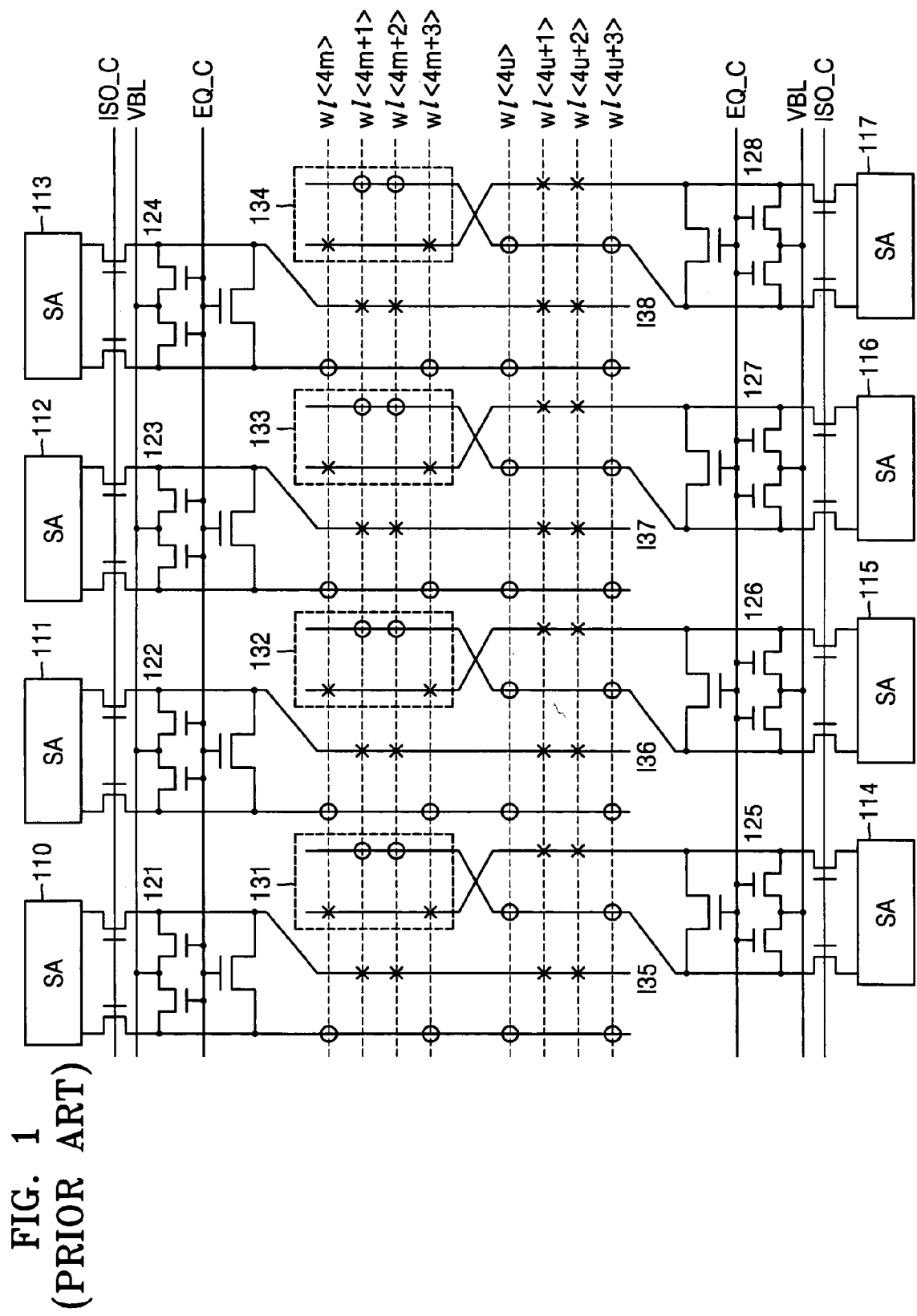
FIG. 1 is a diagram of a simple conventional DRAM memory.
Figure 2A:
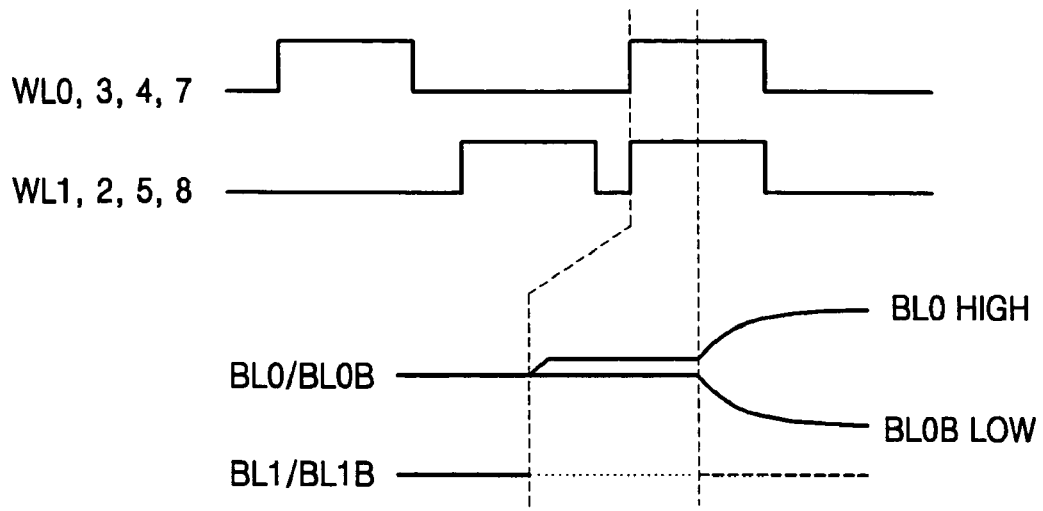
FIGS. 2A and 2B are diagrams illustrating a problem that prevents efficient memory testing.
Figure 2B:
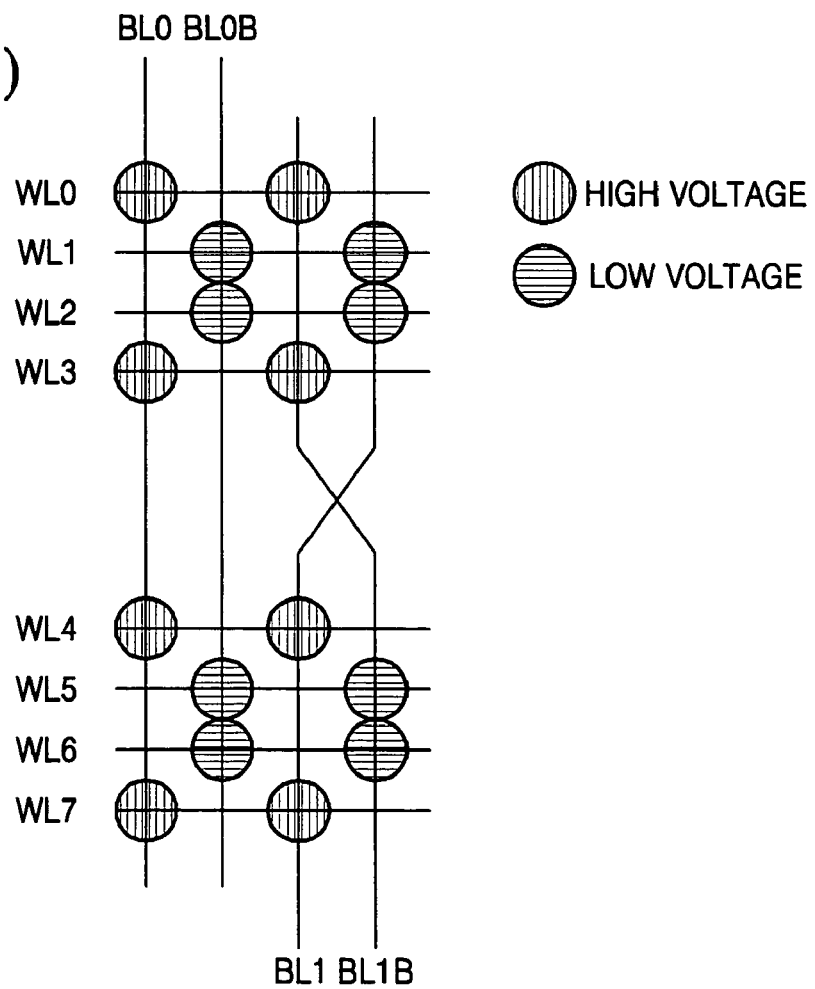

Several preferred embodiments of the present invention will now be described with reference to the accompanying drawings. Various other embodiments of the invention are also possible and practical. This invention may be embodied in many different forms and the invention should not be construed as being limited to the embodiments set forth herein.

The figures listed above illustrate the preferred embodiments of the invention and the operation of such embodiments. In the figures, the size of the boxes is not intended to represent the size of the various physical components. Were the same element appears in multiple figures, the same reference numeral is used to denote the element in all of the figures where it appears.

Only those parts of the various units are shown and described which are necessary to convey an understanding of the embodiment to those skilled in the art. Those parts and elements not shown are conventional and known in the art.

Figure 3:
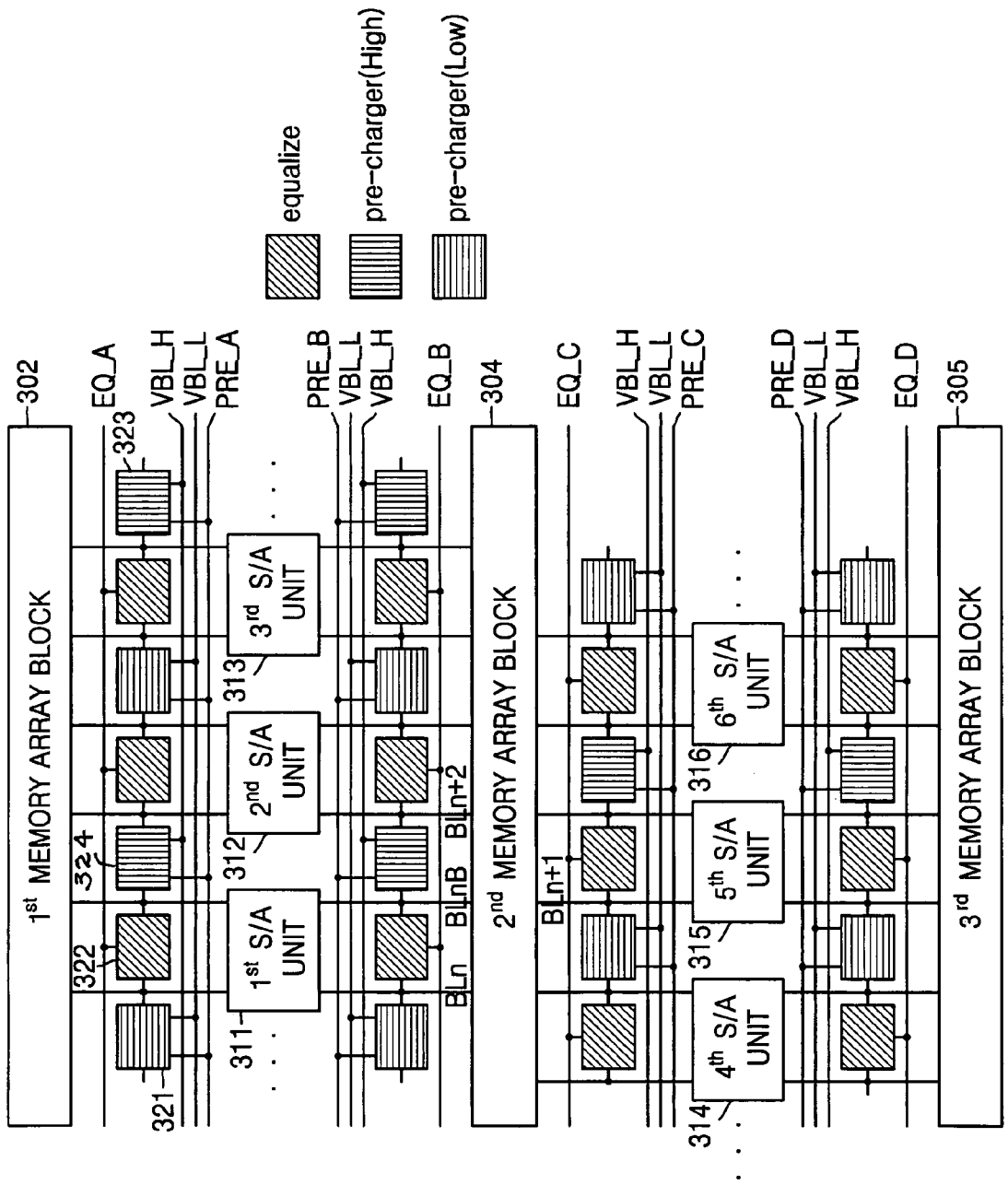
FIG. 3 is a block diagram of a first embodiment.

The layout of a first embodiment is illustrated in FIG. 3. The embodiment shown in FIG. 3 includes three DRAM memory arrays blocks 302, 304 and 305. Six sense amplifiers designated 311 to 316 are located between the memory array blocks. Each sense amplifier is connected to two bit lines as is conventional. Equalizer circuits (shown by the blocks with slanted cross-hatching) are connected between each pair of bit lines as is conventional. A representative equalizer is designated 322; however, it is noted that there is an equalizer circuit between each pair of bit lines.

Pre-charger circuits are represented in FIG. 3 by the rectangles with horizontal and vertical cross-hatching. The rectangles with vertical cross-hatching represent high voltage pre-chargers and the rectangles with horizontal cross-hatching represent the low voltage pre-charger circuits. For example the block designed 321 represents a low voltage pre-charger and the block 324 represents a high voltage pre-charger. The details of the circuitry in the pre-charger circuits, the equalizer circuits, and the memory arrays will be described later with respect to FIGS. 7A, 7B and 7C. The equalizers are controlled by an equalizer control signal EQ_A, EQ_B, etc. and the pre-charge circuits are controlled by a pre-charge control one PRE_A, PRE_B, etc.

Each sense amplifier is connected to a pair of bit lines. For example the sense amplifier 311 is connected between the bit lines designated BLn and BLnB. Likewise the equalizer circuits, for example equalizer circuit 322, are connected between the lines of each pair of bit lines. However, each bit line in each pair of bit lines is connected to a different pre-charger circuit. That is the pre-charger circuits are connected between the pairs of bit lines connected to each sense amplifiers. Thus, during burn-in testing the two bits lines in each bit line pair can be charged to different pre-charge voltages. The result is that during burn-in testing adjacent cells have the high and low voltages illustrated in FIG. 4B. The pre-charger circuits with horizontal cross-hatching are connected to the low voltage line VBL_L and the pre-chargers with vertical cross-hatching are connected to the high voltage line VBL_H.

The terms low voltage and high voltage are used herein to mean voltages that are low and high for the particular circuitry in the memory arrays. These are conventional low and high voltage levels used during burn-in testing. It is noted that during normal operation all bit lines are pre-charged to the same voltage as is conventional.

Figure 4A:
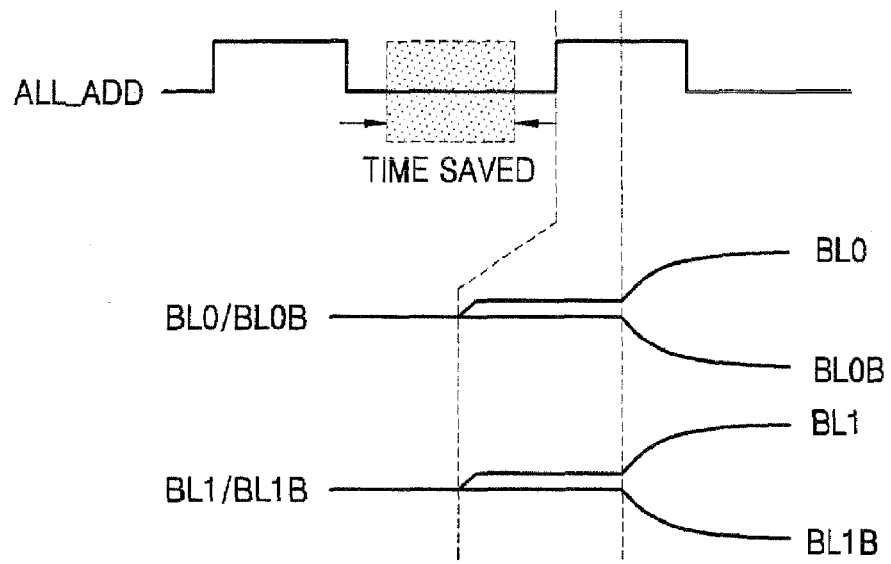
FIGS. 4A and 4B is a diagram showing the voltages on adjacent cells in a first embodiment.
Figure 4B:
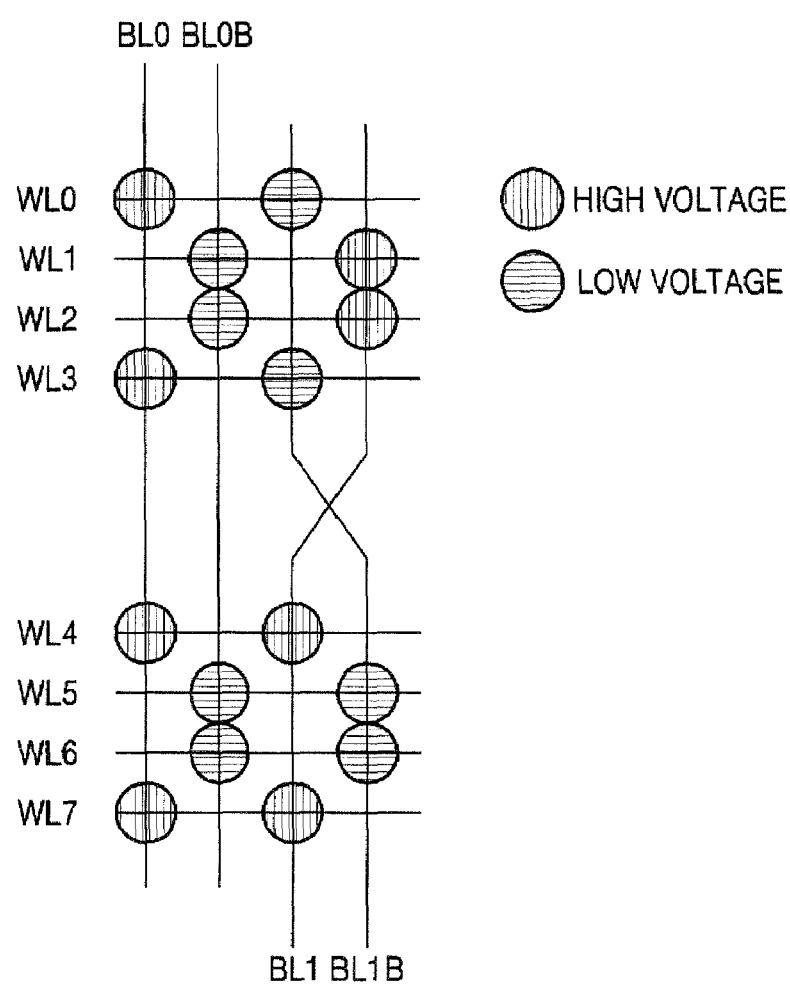

During sense stress testing all of the address lines are simultaneously activated as indicated in FIG. 4A. The voltages on the bit lines BL0 and BL0B and on BL1 and BL1B are as indicted in FIG. 4A. The voltages of adjacent cells are as shown in FIG. 4B. As can be seen from FIG. 4B, each bit line only senses cells charged to a particular voltage. This is the case for both the un-twisted and the twisted bit line pairs.

With the arrangement shown in FIG. 3, it is possible to pre-charge the bit lines and the bit lines bar to different voltage levels at the same time. That is, for example, BL1 and BL1B are connected to different pre-chargers that are in turn connected to different burn in pre-charge voltages VBL_H and VBL_L. For example, the BL1 and BL1B lines can be charged to different voltages at the same time. This shortens the test cycle as indicated in FIG. 4A.

Figure 5A:
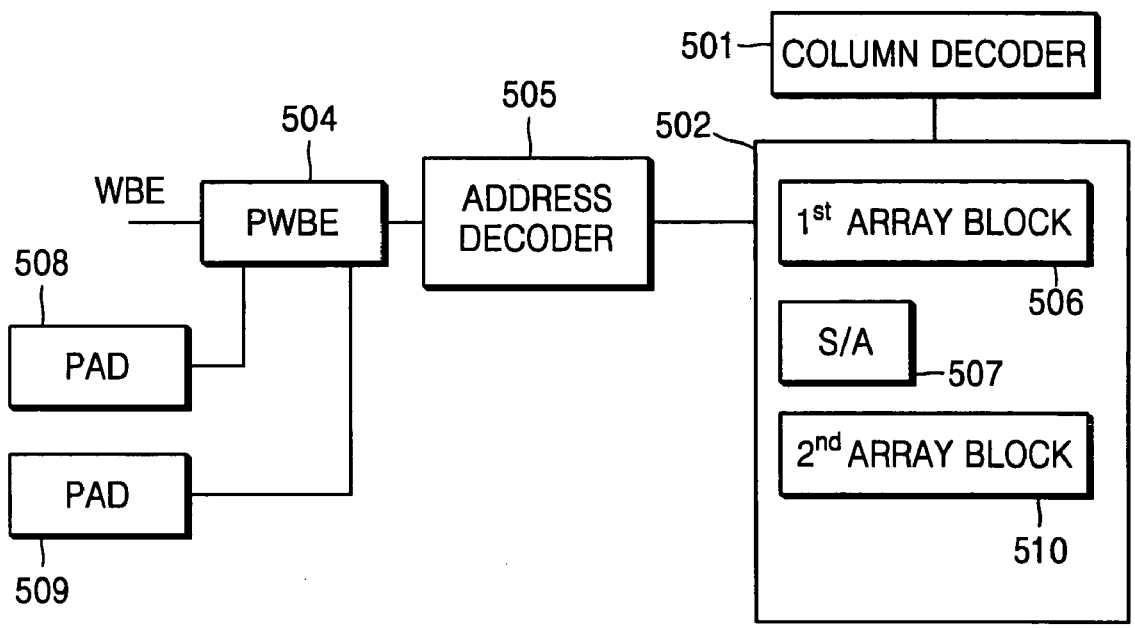
FIGS. 5A and 5B illustrate the test mode structure.
Figure 5B:
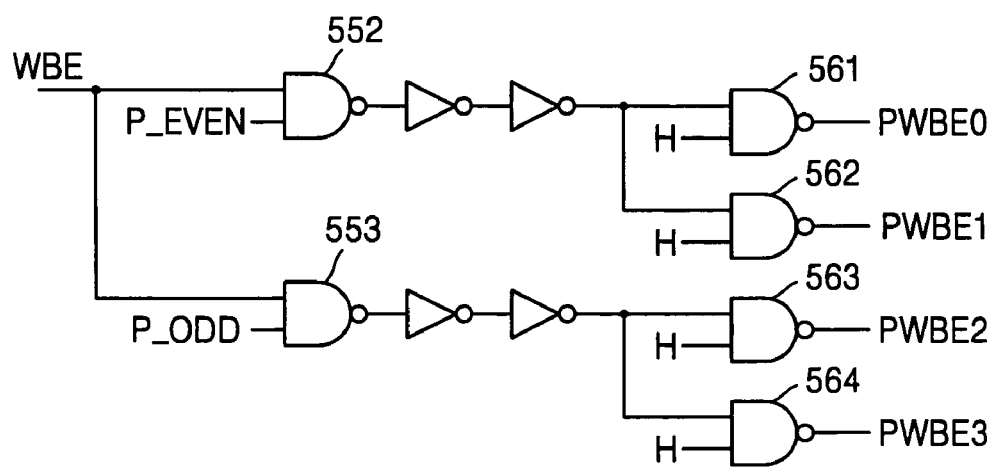

FIGS. 5A and 5B indicate the structure used to conduct wafer burn in test. The column decoder 501 is connected to the memory array 502 that has first and second array blocks 506 and 510. Sense amplifiers 507 are located between arrays 506 and 507. Pads 508 and 509 are connected to the external tester to provide the appropriate signals to the word lines. Detailed diagrams of various embodiments of memory 502 are provided in FIGS. 7A, 7B and 7C. A wafer burn in control signal (WBE) activates the wafer burn in processor 504. Processor 504 in turn activates the address decoder 505.

Two tests can be conducted by the circuitry shown. The two tests are a Sense Stress Test and a Write Stress Test. It is noted that only two pads 508 and 509 are required to provide signals to conduct these tests. The reason that only two pads are required is that, as previously explained the memory includes pre-charges having two voltage levels and during the sense test all lines are simultaneously activated. During the write tests, the word lines are divided into two groups requiring two test pads. However, these same pads can be used to active all lines during the sense test.

Figure 6A:
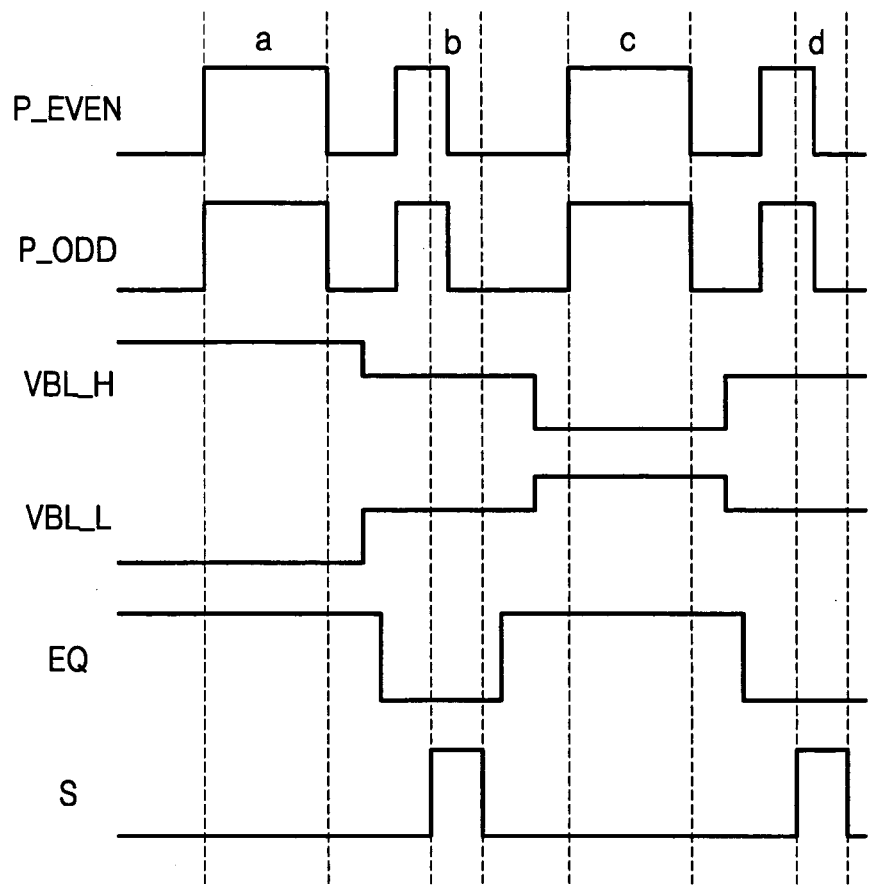
FIGS. 6A and 6B are timing diagrams

The manner that these two tests are conducted will now be described. In the sense stress test, all the word lines are activated simultaneously as described previously. A timing diagram showing how the sense stress test is performed in shown in FIG. 6A. The periods of time a, b, c and d are represented along the horizontal line. It is noted that the word lines P_even and P_odd are simultaneously activated. Likewise the low and high pre-charge VBL_H and VBL_L occur at the same time. Charging occurs in periods a and c. Sensing occurs in periods b and d.

The manner that the address decoder 505 activates the word lines during a write stress test is shown in more detail in FIG. 5B. All of the word lines are activated by the two signals P_even and P-odd that are connected to pads 508 and 509.

During the write stress test, as is conventional, the word lines are divided into two groups of even and odd lines as follows:

1) WL_4K and WL_4K+2
2) WL_4K+1 and WL_4K+3

During the sense stress test all the word lines are simultaneously activated. That is the two above groups are combined into one group as follows:

WL_4K, WL_4K+1, WL_4K+2, and WL_4K+3

Thus both the sense stress test and the write stress test can be conducted using only two test pads. This is in contrast to the four test pads required by the prior art.

As illustrated in FIG. 5B, the two test signals P_even and P_odd provide inputs to gates 561 to 564 in order to generate the signals PWBE0, PWBE1, PWBE2 and PWBE3 that activate word lines as follows:

| | |
|---|---|
| PWBE0 | lines 0, 4, 8, 12 etc. |
| PWBE1 | lines 1, 5, 9, 13 etc |
| PWBE2 | lines 2, 6, 10, 14 etc. |
| PWBE3 | lines 3, 7, 11, 15 etc. |

Figure 6B:
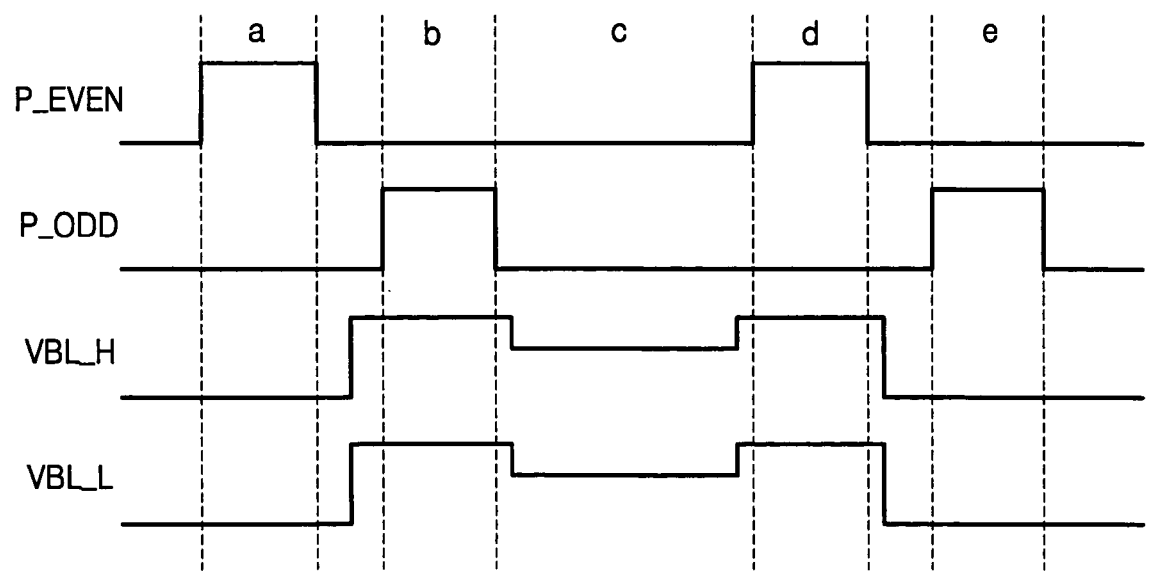

The timing of the operations are shown in FIG. 6B. As in the previous timing diagram, the timing periods a, b, c, etc. are shown along the horizontal axis. In this case, P_even and P_odd word line signals occur in different time periods. However, the bit line signals VBL_L and VBL_H occur at different times. In time period a, data is written into the notes, WL4K, WL4K+2, etc. In time period b, data is written into nodes WL_4K+1, WL_4K+3, etc.

Figure 7A:
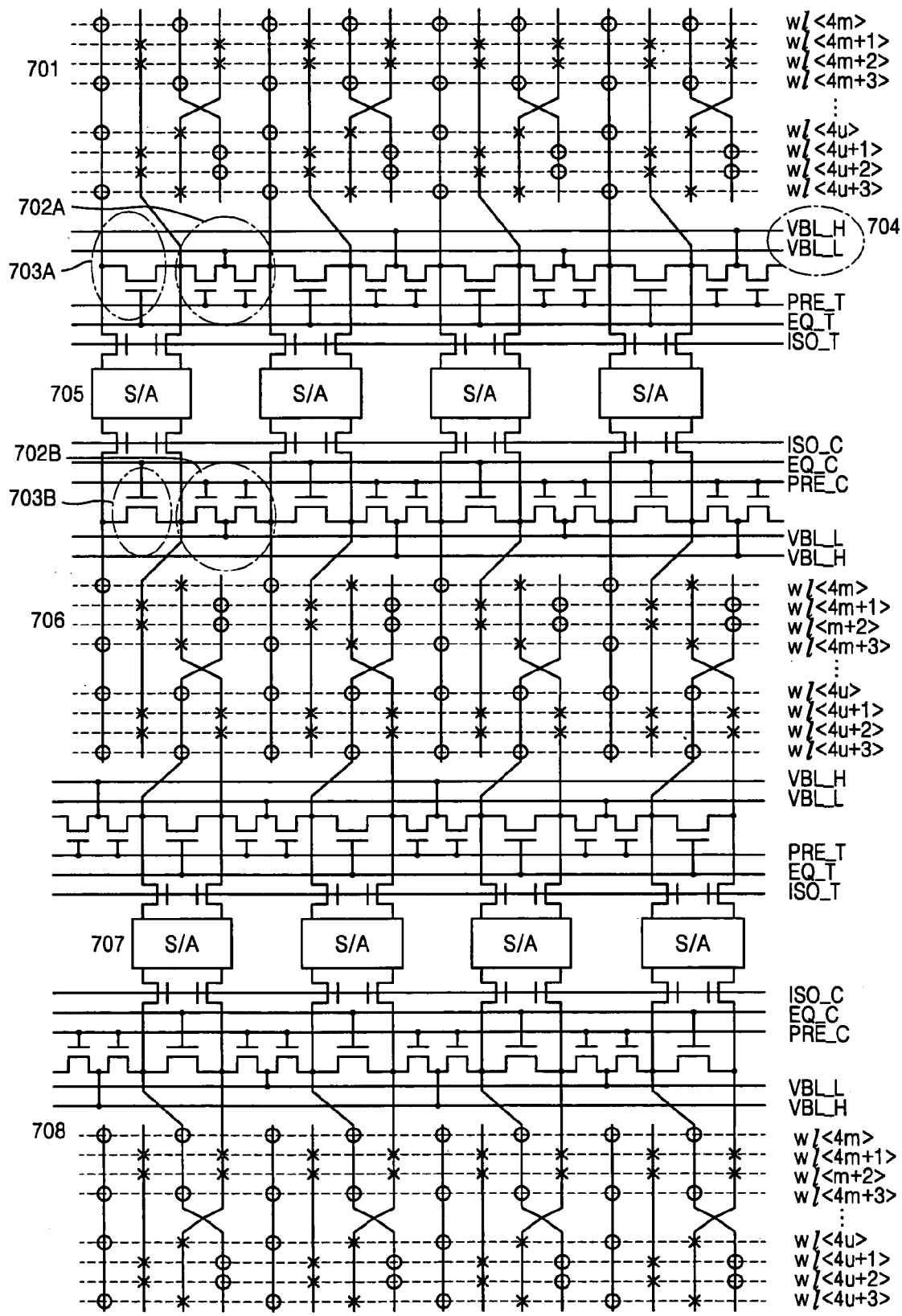
FIGS. 7A, 7B and 7C are diagrams illustrating three different embodiments.
Figure 7B:
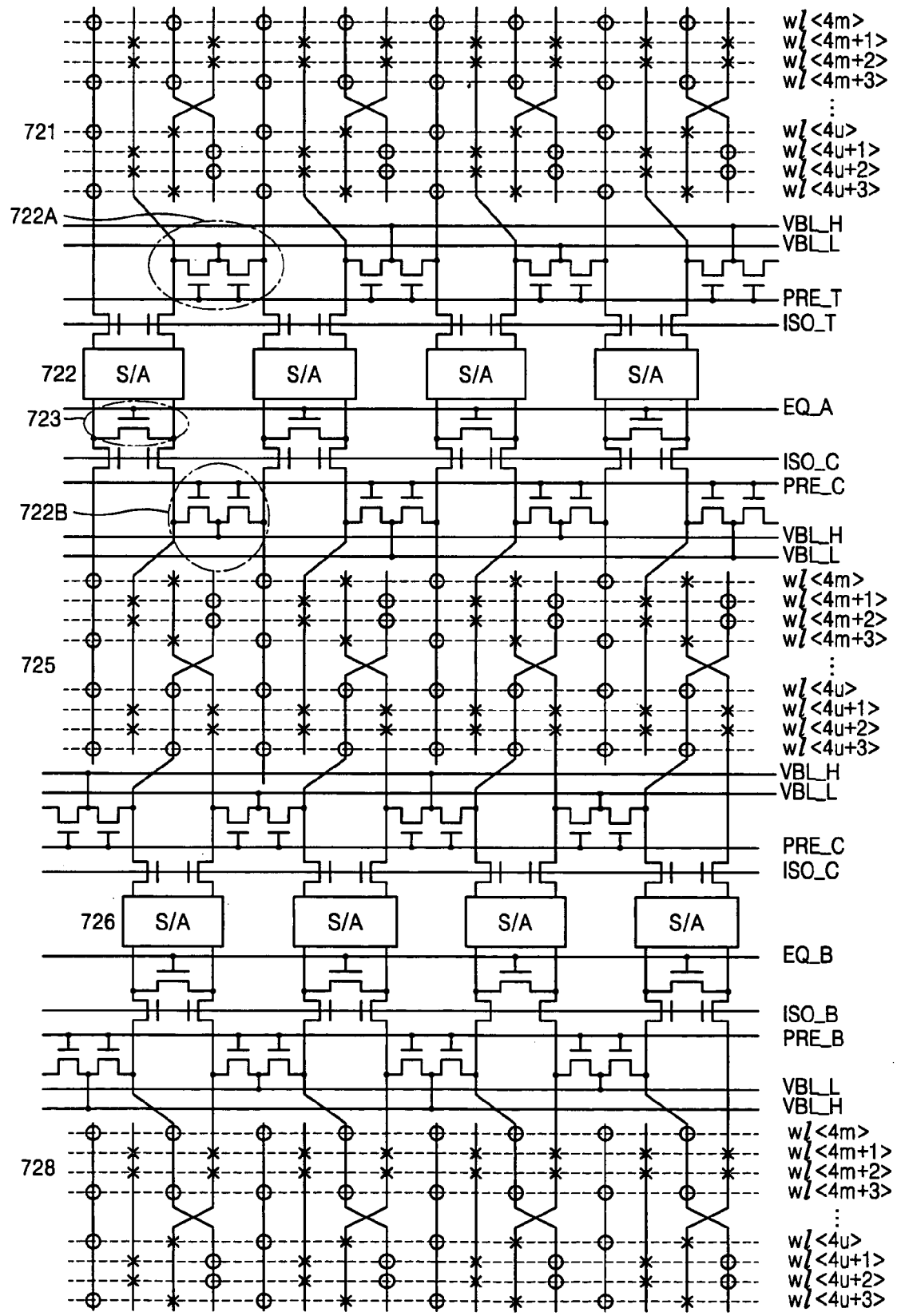
Figure 7C:
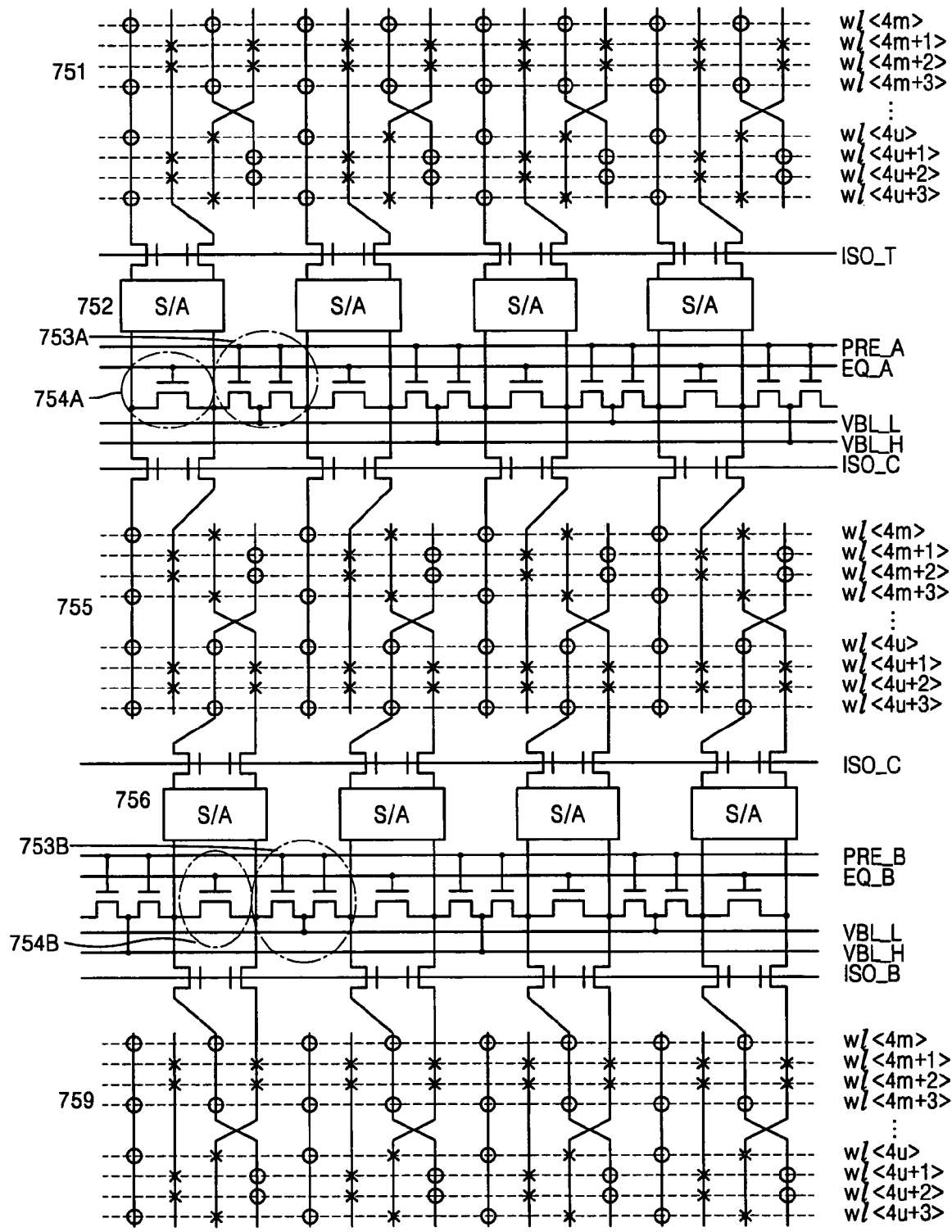

Diagrams of three different embodiments are shown in FIGS. 7A, 7B and 7C. In the embodiment shown in FIG. 7A there is an equalizer circuit and a pre-charge circuit for each pair of bit lines in each array of memory cell. In the embodiment shown in FIG. 7B there is a common equalizer circuit for the bit lines in the two arrays connected to each sense amplifier. In the embodiment shown in FIG. 7B there is a pre-charge circuit for each pair of bit lines in each array of memory cell. In the embodiment shown in FIG. 7C there is a common equalizer circuit and a common pre-charge circuit for the bit lines in the two arrays connected to each sense amplifier.

In summary, in the embodiment shown in FIG. 7A, there is an equalizer and a pre-charge circuit for each pair of bit lines in each array of cells. In the embodiment shown in FIG. 7B, there are common equalizer circuits. In the embodiment shown in FIG. 7C, there are both common equalizer circuits and common pre-charge circuits.

In FIGS. 7A, 7B and 7C, certain equalizer circuits and certain pre-charge circuit is circled and discussed below. It should be noted that while only one pre-charge and equalizer circuit is specifically discussed, the discussion applies to the other equally situated equalizer and pre-charger circuits. Each individual pre-charger circuit and each individual equalizer circuit consists of conventional transistors connected as shown in the figures.

The embodiment shown in FIG. 7A has DRAM memory cell arrays 701, 706 and 708. Sense amplifiers 705 are located between arrays 701 and 706. Sense amplifiers 707 are located between memory arrays 706 and 708. Memory cell array 701 has pre-charge circuits 702A and equalizer circuits 703A. Memory cell array 706 has pre-charge circuits 702B and equalizer circuits 703B. It is noted that the pre-charge circuits are connected to the low and high voltage lines VBL_H and VBL_L as previously described. The same configuration of pre-charge and equalizer circuits is located between arrays 706 and 708.

The embodiment shown in FIG. 7B has DRAM memory cell arrays 721, 725 and 728. Sense amplifiers 722 are located between arrays 721 and 725. Sense amplifiers 726 are located between arrays 725 and 728. Pre-charge circuits 722A are associated with array 721 and pre-charge circuits 722B are associated with array 725. Equalizer 723 serves both memory cell array 721 and memory cell array 725. The same configuration of pre-charge and equalizer circuits appears between memory arrays 725 and 728.

The embodiment shown in FIG. 7C has DRAM memory cell arrays 751, 755 and 759. Sense amplifiers 752 are located between arrays 751 and 755. Sense amplifiers 756 are located between arrays 755 and 759. Pre-charge circuits 753A are located between and serve both memory cell array 751 and memory cell array 755. Likewise equalizer circuits 754A are located between and serve both memory cell array 751 and memory cell array 755. Pre-charge circuits 753B and equalizer circuits 754B serve arrays 755 and 759.

It should be understood that in FIGS. 3, 7A, 7B and 7C only three memory arrays blocks are shown. Only three memory blocks are shown for convenience of illustration and explanation. Other embodiments include various other numbers of memory blocks. Furthermore it is noted that the entire width of the memory is not shown in the Figures. The remaining parts of the memory are configured similar to the part of the memory that is illustrated While the invention has been shown and described with respect to preferred embodiments thereof, it should be understood that a wide variety of other embodiments are possible without departing from the scope and spirit of the invention. The scope of the invention is only limited by the appended claims.

We claim:

1. A semiconductor memory device comprising;

a plurality of memory cells arranged in a two dimensional matrix of memory cells, said matrix of memory cells being divided into a plurality of two dimensional arrays of memory cells, a plurality of word lines, said word lines traversing said matrix of cells in a first direction, a plurality of bit line pairs, said bit lines traversing said matrix in a second direction, each pair of bit lines having a first and second bit line, one of said memory cells being located at the intersection of a word line and either one of said first or said second bit lines, alternate pairs of said bit lines being twisted between adjacent arrays of memory cells, each pair of bit lines having an associated sense amplifier to detect voltage differences between said pair of bit lines, a plurality of pre-charge circuits, each pre-charge circuit charging one bit line of two adjacent bit line pairs, the two bit lines in each bit line pair being charged to different voltages, and a sense stress test circuit for simultaneously activating all word lines, whereby when said pre-charge circuits charge the two bit lines in each bit line pair to different voltages, and all word lines are simultaneously activated, each bit line only senses cells charged to one particular voltage.

2. The semiconductor memory device recited in claim 1 wherein said pre-charge circuits are physically located between said bit line pairs.

3. The semiconductor memory device recited in claim 1, wherein during sense testing said pre-charge circuit charges the two bit lines in each pair of bit lines to different pre-charge voltages.

4. The semiconductor memory device recited in claim 3 wherein during sense testing all word lines are simultaneously enabled.

5. The semiconductor memory device recited in claim 4 wherein during sense testing all the cells sensed by each bit are pre-charged to the same voltage.

6. The semiconductor memory device recited in claim 1 wherein said memory cells are DRAM memory cells.

7. The semiconductor memory device recited in claim 1 including an equalizer circuit associated with each pair of bit lines.

8. The semiconductor memory device recited in claim 7 wherein there are separate pre-charge circuits and separate equalizer circuits associated with each memory array.

9. The semiconductor memory device recited in claim 7 wherein there are separate pre-charge circuits associated with each memory array and equalizer circuits are shared by bit lines in two memory arrays.

10. The semiconductor memory device recited in claim 7 wherein pre-charge circuits and equalizer circuits are shared by bit lines in two memory arrays.

11. The semiconductor memory device recited in claim 1 wherein said pre-chargers are arranged into two sets of pre-chargers, the two lines in each bit line pair being connected to pre-chargers in different sets of pre-chargers, whereby during test operations each set of pre-chargers can charge to different voltages so that the two bit lines in each bit line pair will be charged to different voltages.

12. In a semiconductor memory having a plurality of memory cells arrays, a plurality of word lines, bit line pairs having two bit lines, and sense amplifiers to detect voltages on said bit line pairs, alternate pairs of said bit lines being twisted between adjacent memory cell arrays, the improvement comprising, pre-charge circuits located between adjacent pairs of said bit lines, each pre-charge circuit charging bit line in the two adjacent bit line pairs, said pre-charge circuits being adapted to charge the two bit lines of each bit line pair to different voltages during test operations, whereby during burn in sense test, when all of said word lines are activated simultaneously, voltages will appear on all of said bit lines.

13. The semiconductor memory recited in claim 12 wherein during normal operation, said pre-charge circuits charge said bit lines to the same per-charge voltage.

14. The semiconductor memory recited in claim 12 including an equalizer circuit for each bit line pair.

15. The semiconductor memory device recited in claim 14 wherein there are separate sets of pre-charge circuits and separate sets of equalizer circuits associated with each memory array.

16. The semiconductor memory device recited in claim 14 wherein there are separate sets of pre-charge circuits associated with each memory array and said equalizer circuits are shared by bit lines in two memory arrays.

17. The semiconductor memory device recited in claim 14 wherein pre-charge circuits and equalizer circuits are shared by bit lines in two memory arrays.

18. A semiconductor memory comprising, memory cells at the intersection of word lines and bit lines, said bit lines being organized in bit line pairs, each pair having a bit line and a bit line bar, each word line intersecting a memory cell at either a bit line or a bit line bar in each bit line pair, each bit line pair having a sense amplifier, said memory cells being arranged in memory cell arrays, each cell array having a plurality of cell blocks, pairs of bit lines being twisted between array blocks, and a pre-charger circuit for one bit line in two bit line pairs, each pre-charger charging one bit line in two bit line pairs, simultaneously activating all word lines when said pre-charge circuits adapted to charge the two bit lines in each bit line pair to different voltages during burn in sense test.

19. The semiconductor memory of claim 18 wherein during selected test operations said pre-charge circuits charge said bit lines in each bit line pair to different voltages and during normal operation, said pre-charger circuit charges the bit lines in each bit line pair to the same voltage.

20. The memory circuit recited in claim 1 including two test pads and logic to activate all even word lines or all odd word lines simultaneously during a write test operation.

* * * * *

UNITED STATES PATENT AND TRADEMARK OFFICE
CERTIFICATE OF CORRECTION

| | |
|---|---|
| PATENT NO. | : 7,327,610 B2 |
| APPLICATION NO. | : 11/245350 |
| DATED | : February 5, 2008 |
| INVENTOR(S) | : Young-Ju Choi et al. |

It is certified that error appears in the above-identified patent and that said Letters Patent is hereby corrected as shown below:

Column 1, line 8, the word "10-2094-0091454" should read -- 10-2004-0091454 --;
Column 1, line 60, the word "activaqted" should read -- activated --.

Signed and Sealed this

Twenty-sixth Day of August, 2008

JON W. DUDAS
*Director of the United States Patent and Trademark Office*